United States Patent
Suzuki et al.

(10) Patent No.: US 11,042,310 B2
(45) Date of Patent: *Jun. 22, 2021

(54) READING OF START-UP INFORMATION FROM DIFFERENT MEMORY REGIONS OF A MEMORY SYSTEM

(71) Applicant: KIOXIA CORPORATION, Tokyo (JP)

(72) Inventors: Riki Suzuki, Kanagawa (JP);
Toshikatsu Hida, Kanagawa (JP);
Takehiko Amaki, Kanagawa (JP);
Shunichi Igahara, Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 25 days.

This patent is subject to a terminal disclaimer.

(21) Appl. No.: 16/506,475

(22) Filed: Jul. 9, 2019

(65) Prior Publication Data
US 2019/0332285 A1 Oct. 31, 2019

Related U.S. Application Data

(63) Continuation of application No. 15/786,959, filed on Oct. 18, 2017, now Pat. No. 10,437,490.

(30) Foreign Application Priority Data

Oct. 18, 2016 (JP) ............... JP2016-203982

(51) Int. Cl.
*G06F 3/06* (2006.01)
*G06F 11/10* (2006.01)
(Continued)

(52) U.S. Cl.
CPC .......... *G06F 3/0619* (2013.01); *G06F 3/0616* (2013.01); *G06F 3/0634* (2013.01);
(Continued)

(58) Field of Classification Search
CPC .... G06F 3/0619; G06F 3/0634; G06F 3/0658; G06F 12/0875; G06F 11/1068;
(Continued)

(56) References Cited

U.S. PATENT DOCUMENTS 8,817,569 B2  8/2014  Duzly et al.
9,318,212 B2  4/2016  Tokiwa
(Continued)

FOREIGN PATENT DOCUMENTS

JP  2014-154197 A  8/2014
WO  2015033404 A1  3/2015

*Primary Examiner* — Thien Nguyen
(74) *Attorney, Agent, or Firm* — Kim & Stewart LLP

(57) ABSTRACT

A memory system includes a nonvolatile semiconductor memory including a first memory region for storing start-up information and a second memory region for storing a copy of the start-up information, a volatile semiconductor memory, and a controller. The controller is configured to determine whether or not an address of the second memory region is stored in the volatile semiconductor memory, issue a first start-up read command, which designates no read address, to the nonvolatile semiconductor memory to read the start-up information from the first memory region if the address of the second memory region is not stored in the volatile semiconductor memory, and issue a second start-up read command, which designates the address of the second memory region as a read address, to read the start-up information from the second memory region if the address of the second memory region is stored in the volatile semiconductor memory.

20 Claims, 9 Drawing Sheets

(51) Int. Cl.
*G11C 29/00* (2006.01)
*G06F 12/02* (2006.01)
*G06F 12/0875* (2016.01)
*G11C 29/52* (2006.01)

(52) U.S. Cl.
CPC .......... *G06F 3/0635* (2013.01); *G06F 3/0656* (2013.01); *G06F 3/0658* (2013.01); *G06F 3/0679* (2013.01); *G06F 11/1048* (2013.01); *G06F 11/1068* (2013.01); *G06F 12/0246* (2013.01); *G06F 12/0875* (2013.01); *G11C 29/52* (2013.01); *G11C 29/74* (2013.01); *G11C 29/78* (2013.01); *G06F 2212/1032* (2013.01); *G06F 2212/2022* (2013.01); *G06F 2212/45* (2013.01); *G06F 2212/7203* (2013.01)

(58) Field of Classification Search
CPC ................ G06F 3/0679; G06F 3/0656; G06F 2212/1032; G06F 2212/2022; G06F 2212/45; G11C 29/78; G11C 29/74; G11C 29/52

See application file for complete search history.

(56) References Cited

U.S. PATENT DOCUMENTS

| | | | |
|---|---|---|---|
| 9,613,720 B2 | 4/2017 | Yamaguchi et al. | |
| 2009/0254776 A1* | 10/2009 | Gonzalez | G06F 11/1068 714/6.12 |
| 2013/0265841 A1 | 10/2013 | Duzly et al. | |
| 2015/0026393 A1* | 1/2015 | Kaminaga | G06F 3/0611 711/103 |
| 2016/0139811 A1* | 5/2016 | Ikeuchi | G06F 3/0629 711/170 |
| 2017/0123814 A1* | 5/2017 | Seo | G06F 3/0647 |

\* cited by examiner

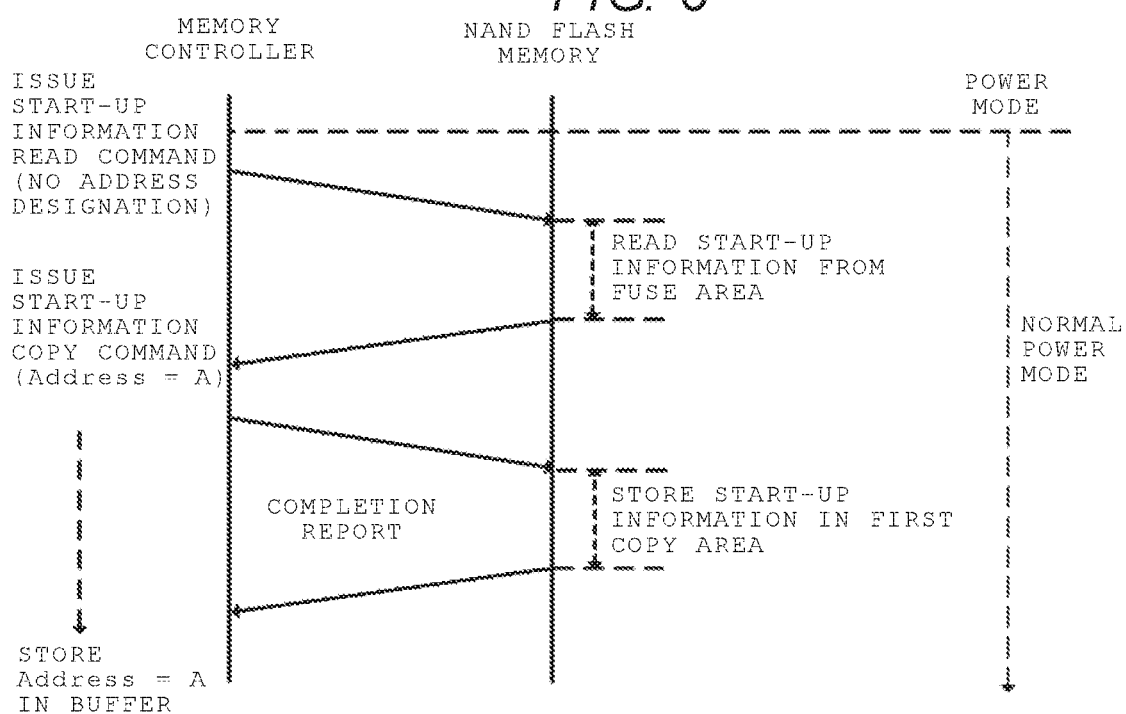

READING OF START-UP INFORMATION FROM DIFFERENT MEMORY REGIONS OF A MEMORY SYSTEM

CROSS-REFERENCE TO RELATED APPLICATIONS

This application is a continuation of U.S. patent application Ser. No. 15/786,959, filed on Oct. 18, 2017, which is based upon and claims the benefit of priority from Japanese Patent Application No. 2016-203982, filed on Oct. 18, 2016, the entire contents of each of which are incorporated herein by reference.

FIELD

Embodiments described herein relate generally to a memory system and a control method thereof.

BACKGROUND

As data are read from a memory element of a nonvolatile semiconductor memory repeatedly, the memory element deteriorates. Accordingly, when data are read repeatedly from the same memory area of the nonvolatile semiconductor memory, reliability of the memory system may decrease.

DESCRIPTION OF THE DRAWINGS

FIG. 5 is a table for explaining different power modes according to the first embodiment.

FIG. 6 is a diagram for explaining a power-on sequence according to the first embodiment.

DETAILED DESCRIPTION

Figure 1:
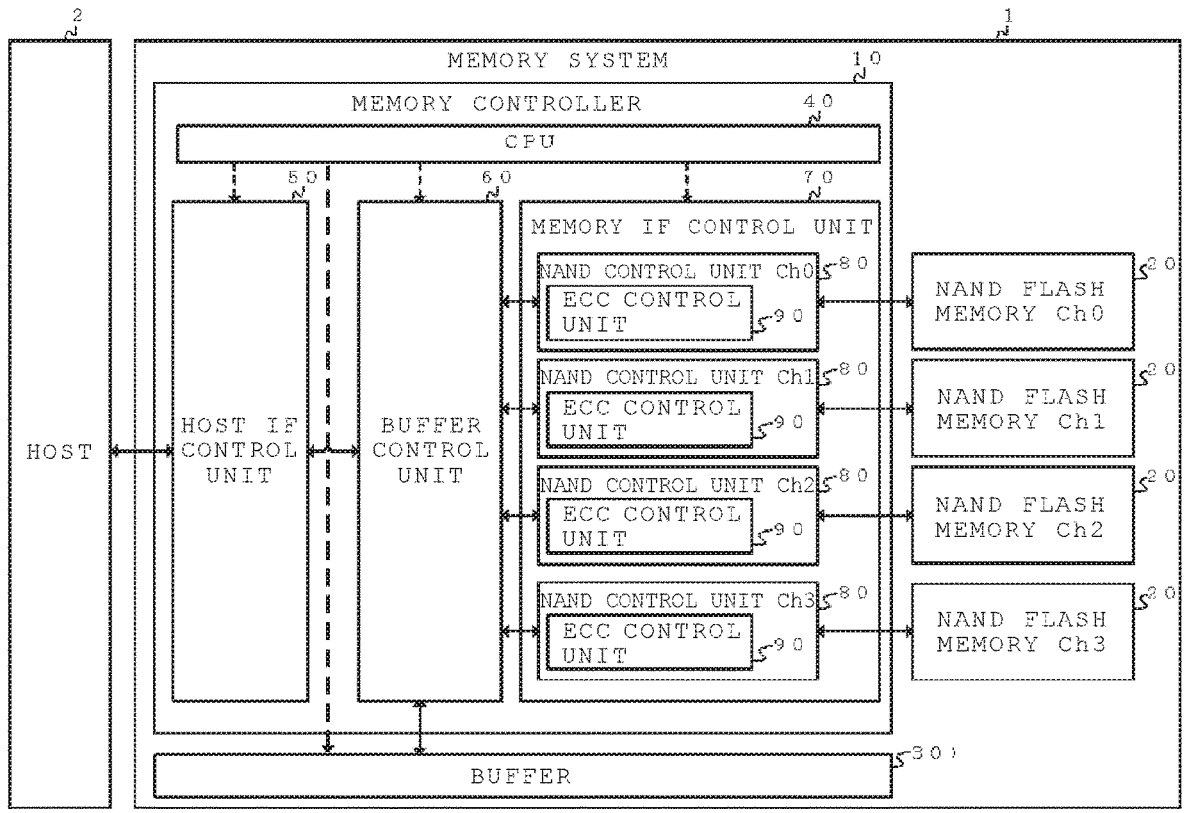
FIG. 1 is a block diagram of a memory system according to a first embodiment.

An embodiment is directed to improving reliability of a memory system.

In general, according to an embodiment, a memory system includes a nonvolatile semiconductor memory including a first memory region for storing start-up information and a second memory region for storing a copy of the start-up information, a volatile semiconductor memory, and a controller. The controller is configured to determine whether or not an address of the second memory region is stored in the volatile semiconductor memory, issue a first start-up read command, which designates no read address, to the nonvolatile semiconductor memory to read the start-up information from the first memory region if the address of the second memory region is not stored in the volatile semiconductor memory, and issue a second start-up read command, which designates the address of the second memory region as a read address, to read the start-up information from the second memory region if the address of the second memory region is stored in the volatile semiconductor memory.

In the following, a memory system of an example embodiment will be described with reference to the drawings. In the following description, components having the same function and configuration are denoted by the same reference numerals.

First Embodiment

FIG. 1 is a block diagram of a memory system according to a first embodiment.

The memory system 1 can communicate with a host 2. The memory system 1 includes a memory controller 10, a plurality of nonvolatile semiconductor memory chips 20, and a buffer 30.

The memory controller 10 communicates with the host 2, and controls the entire operation of the memory system 1. For example, the memory controller 10 is a semiconductor integrated circuit configured as a system on a chip (SoC).

In the description of the present embodiment, the host 2 is a computer that supports an interface based on a serial ATA (SATA) standard. The host 2 may support an interface of other standards, such as a serial attached SCSI (SAS) standard and an NVM Express (NVMe®).

The nonvolatile semiconductor memory 20 store data in a nonvolatile manner. The nonvolatile semiconductor memory 20 of the present embodiment is a NAND flash memory. The nonvolatile semiconductor memory 20 may be another nonvolatile semiconductor memory such as a three-dimensional structure flash memory, a NOR type flash memory, and a magnetoresistive random access memory (MRAM). In the following description, the nonvolatile semiconductor memory 20 is referred to as a NAND flash memory 20.

The memory system 1 of the present embodiment includes the NAND flash memory chips 20 connected to four channels (Ch). The memory controller 10 can control in parallel the NAND flash memory chips 20 connected to each channel. A plurality of NAND flash memory chips 20 may be connected to one channel. In the following description, the NAND flash memory chips 20 connected to each of the plurality of channels are represented as NAND flash memory chips Ch0 to Ch3. The number of channels may be greater or less than four.

The buffer 30 stores data in a volatile manner and temporarily. The data stored in the buffer 30 include (1) data received from the host 2, (2) data read from the NAND flash memory 20, (3) information required to control the memory system 1 by the memory controller 10, and the like.

The buffer 30 of the present embodiment is a dynamic random access memory (DRAM). The buffer 30 may be a volatile semiconductor memory of another type such as a static random access memory (SRAM). The buffer 30 may be in the memory controller 10.

The memory controller 10 includes a central processing unit (CPU) 40, a host interface (IF) control unit 50, a buffer control unit 60, and a memory interface (IF) control unit 70.

The CPU 40 controls the entire memory system 1 based on firmware (FW). The CPU 40 may be a separate semiconductor integrated circuit not in the memory controller 10. A part or all of functions that are hereinafter described to be performed by the FW can be performed by dedicated hardware (HW), and a part or all of functions that are hereinafter described to be performed by the HW can be performed by the FW.

The host interface (IF) control unit 50 mainly decodes and executes commands received from the host 2. The buffer control unit 60 mainly writes and reads data to or from the buffer 30, and manages an available area of the buffer 30.

The memory IF control unit 70 includes a plurality of NAND control units 80. Here, the NAND control units 80 are connected to the NAND flash memory chips Ch0 to Ch3, respectively (in the following, the NAND control unit 80 may be referred to as NAND control unit Ch0 to Ch3, when a particular NAND control unit 80 is being described). Each NAND control unit 80 controls an operation such as write, read, erase, and the like of data with respect to the NAND flash memory 20.

Each NAND control unit 80 includes an ECC control unit 90. The ECC control unit 90 appends an error correction code to data to be written in the NAND flash memory 20. The error correction code can be a Reed-Solomon (RS) code, a Bose-Chaudhuri-Hocquenghem (BCH) code, a low-density parity-check (LDPC) code, or the like. The ECC control unit 90 performs an error correction process based on the error correction code with respect to data read from the NAND flash memory 20.

Next, with reference to FIG. 2A and FIG. 2B, a configuration of a physical page 100 and a physical block 110 of the NAND flash memory 20 will be described.

Figure 2A:
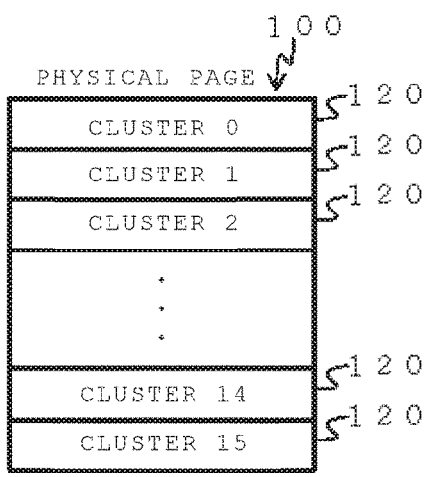
FIGS. 2A and 2B schematically illustrate a configuration of a physical page and a physical block according to the first embodiment.

As described in FIG. 2A, a minimum management unit of write and read of data in the memory system 1 is called a cluster 120. In the present embodiment, a size of the cluster 120 is 4 kB. In addition, a minimum unit by which write and read are performed in the NAND flash memory 20 is called a physical page 100. In the present embodiment, a size of the physical page 100 is 16 clusters (4 kB×16 clusters=64 kB).

Figure 2B:
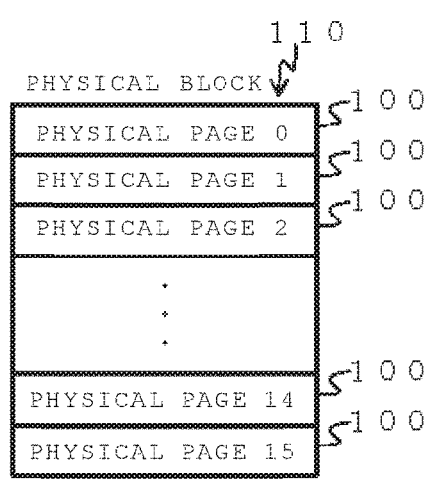

In addition, as described in FIG. 2B, the minimum unit by which the erase is performed in the NAND flash memory 20 is called a physical block 110. In the present embodiment, the size of the physical block 110 is 16 physical pages (64 kB×16 physical pages=1,024 kB). Note, the particular size of each of these units is only an example, and any other size may be used as sizes of these values.

A data stored in a memory element may become corrupted by the repeated access to the memory element or other memory elements in the NAND flash memory 20, or as time elapses since storing. A memory element in the NAND flash memory 20 may also become deteriorated by the write, read, and erase of data. Thus, in order to extend life of the memory system 1, it is desirable to minimize the number of times of the write or read of data per physical page 100, as well as the number of times of the erase of data per physical block 110.

Next, with reference to FIG. 3 and FIG. 4, a memory configuration will be described.

Figure 3:
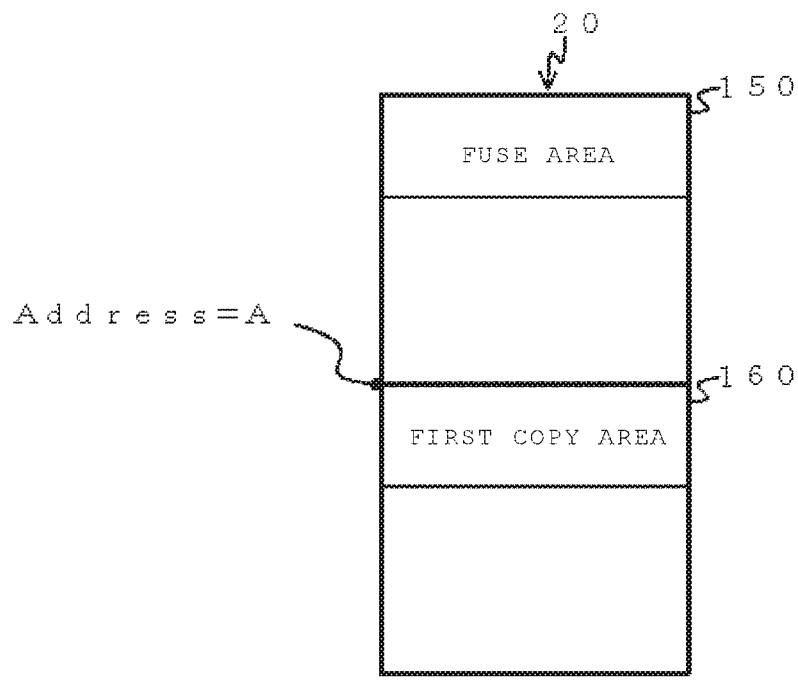
FIG. 3 schematically illustrates a memory configuration according to the first embodiment.

As described in FIG. 3, the NAND flash memory 20 includes a fuse area 150. The fuse area 150 is configured with one physical block 110 in the present embodiment, but the configuration of the fuse area 150 is not limited thereto.

Figure 4:
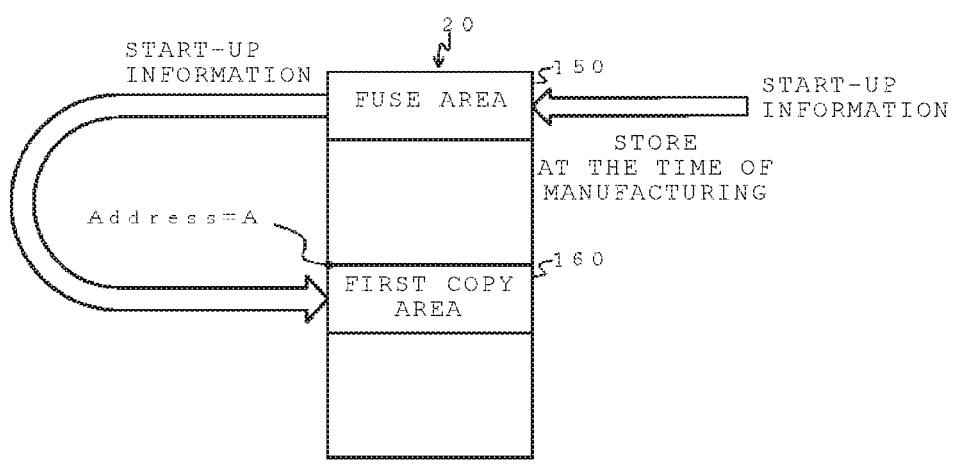
FIG. 4 schematically illustrates memory areas to store start-up information according to the first embodiment.

As described in FIG. 4, information such as defective bits, columns and blocks, operating parameters such as read/program/erase voltages, numbers of program loops or erase loops, and operating mode settings, and the like of the NAND flash memory 20 is stored in the fuse area 150 at the time of manufacturing the NAND flash memory 20 (e.g., before factory shipment). The fuse area 150 can only be read after the factory shipment. That is, the fuse area 150 is read-only, i.e., not writable. The information stored in the fuse area 150 is used by the NAND flash memory 20 at time of starting up of the NAND flash memory 20. In the following, this information read from the fuse area 150 is referred to as start-up information. In some examples, the error correction code may be appended to the start-up information.

In addition, the memory controller 10 manages a part of the NAND flash memory 20 as a first copy area 160. The first copy area 160 is configured as one physical block 110 in the present embodiment, but the configuration of the first copy area 160 is not limited thereto.

In the first copy area 160, write, read, and erase of data can be performed under the control of the memory controller 10. The first copy area 160 is accessed in association with an address=A designated by the memory controller 10. The start-up information is stored in the first copy area 160 under the control of the memory controller 10.

So far, a structure of the memory system 1 has been described. In the following, power modes of the memory system 1 and a boot sequence of the memory system 1 will be described.

As described in FIG. 5, the memory system 1 can take three power modes: a normal power mode, a first low power mode, and a second low power mode. In the normal power mode, electric power is supplied to all of the memory controller 10, the NAND flash memory 20, and the buffer 30. In the first low power mode, the electric power is not supplied to the NAND flash memory 20, but supplied to the memory controller 10 and the buffer 30. In the second low power mode, the electric power is not supplied to any of the memory controller 10, the NAND flash memory 20, and the buffer 30. The power consumption of the memory system 1 descends in order of the normal power mode, the first low power mode, and the second low power mode.

In the following, a transition from the first low power mode to the normal power mode is referred to as WARM boot. A transition from the second low power mode to the normal power mode is referred to as COLD boot. The WARM boot is faster than the COLD boot.

Next, with reference to FIG. 6, an operation sequence (e.g., power on sequence) of the memory system 1 at the time of starting to supply the electric power will be described.

When the electric power is first supplied to the memory system 1 and any necessary initialization process has been completed, the memory controller 10 issues a start-up information read command with no address designation, to the NAND flash memory 20. The NAND flash memory 20 receiving the start-up information read command with no address designation, reads the start-up information from the fuse area 150. The NAND flash memory 20 initializes itself by referring to the start-up information. In addition, the start-up information which has been read from the fuse area 150 may be transmitted from the NAND flash memory 20 to the memory controller 10 for further use.

Next, the memory controller 10 issues a start-up information copy command designating the address=A as a copy destination to the NAND flash memory 20. As described above, the address=A is associated with the first copy area 160. The NAND flash memory 20 that received the start-up information copy command copies the start-up information from the fuse area 150 into the memory area which is associated with the address=A, that is, into the first copy area 160. The NAND flash memory 20 reports completion of the start-up information copy command to the memory controller 10.

The memory controller 10 stores the address=A in the buffer 30. Further, the memory controller 10 may store the address=A into the NAND flash memory 20 to maintain the address of the first copy area 160 permanently.

If the start-up information copy operation has been performed once already, it is possible to omit the start-up information copy process from a next power on sequence in some instances. It is also possible to omit the start-up information copy process even when the address stored in the buffer 30 is lost by a power interrupt, by obtaining the address stored in the NAND flash memory 20.

Figure 7:
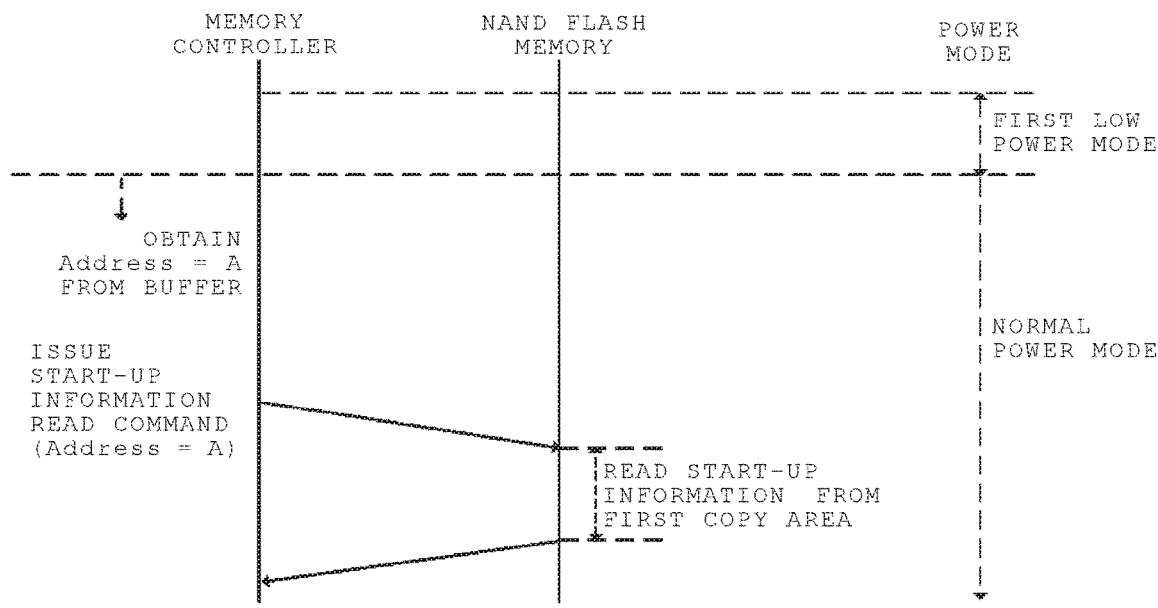
FIG. 7 is a diagram for explaining WARM boot according to the first embodiment.

Next, with reference to FIG. 7, an operation sequence of the WARM boot will be described.

When the WARM boot is performed in the memory system 1, the memory controller 10 obtains the address=A stored in the buffer 30. The memory controller 10 then issues the start-up information read command with address designation, designating the address=A to the NAND flash memory 20. The NAND flash memory 20 that received the start-up information read command with address designation, reads the start-up information from the memory area associated with the address=A, that is, from the first copy area 160, instead from the fuse area 150. The NAND flash memory 20 initializes itself by referring to the start-up information read from the first copy area 160. In addition, the start-up information that is read from the first copy area 160 may be transmitted from the NAND flash memory 20 to the memory controller 10. The memory controller 10 may store the received start-up information in the buffer 30 for further use. For example, upon initializing the NAND flash memory 20 in the WARM boot, the controller may transmit the start-up information in the buffer 30 to the NAND flash memory 20, instead of instructing the NAND flash memory 20 to read the start-up information from the fuse area 150 or the first copy area 160.

Figure 8:
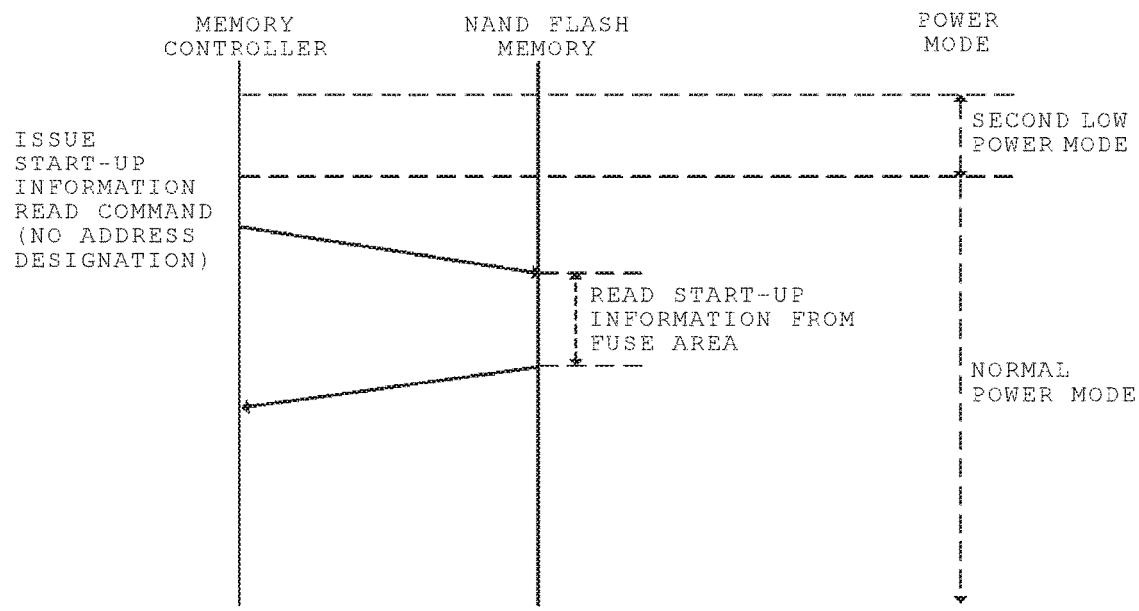
FIG. 8 is a diagram for explaining COLD boot according to the first embodiment.

Next, with reference to FIG. 8, an operation sequence of the COLD boot will be described.

When the COLD boot is performed in the memory system 1, the memory controller 10 issues the start-up information read command with no address designation, with respect to the NAND flash memory 20. At the time of the second low power mode, since the electric power is not supplied to the buffer 30, information of the address=A stored in the buffer 30 has been lost. Accordingly, the start-up information read command with address designation cannot be used. Thus, the NAND flash memory 20 that received the start-up information read command with no address designation, reads the start-up information from the fuse area 150. The NAND flash memory 20 initializes itself by referring to the start-up information read from the fuse area 150. In addition, the start-up information read from the fuse area 150 may then be transmitted from the NAND flash memory 20 to the memory controller 10. The memory controller 10 may store the received start-up information in the buffer 30.

Figure 9:
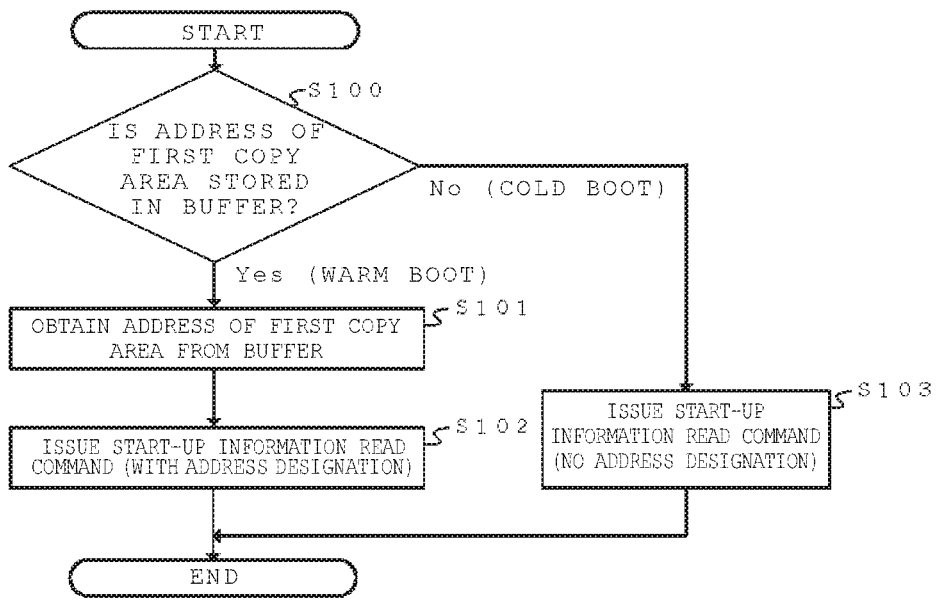
FIG. 9 is a flowchart for explaining a control procedure of firmware at the time of booting according to the first embodiment.

Next, with reference to FIG. 9, a control procedure of FW at the time of booting the memory system 1 will be described.

When an address associated with the first copy area 160 is stored in the buffer 30, that is, the transition is the WARM boot (S100: Yes), the CPU 40 based on FW obtains the address associated with the first copy area 160 (S101). Next, the CPU 40 instructs the NAND control unit 80 to issue the start-up information read command with address designation, by using the obtained address (S102).

When the address associated with the first copy area 160 is not stored in the buffer 30, that is, the transition is the COLD boot (S100: No), the CPU 40 instructs the NAND control unit 80 to issue the start-up information read command with no address designation (S103).

Another method for determining whether the transition is the WARM boot or the COLD boot may also be used in the above flow. For example, a type of booting may be notified from the host 2 rather than evaluating whether the buffer 30 stores the address associated with the first copy area.

According to the memory system of the first embodiment described above, since the memory area that stores the start-up information at the time of starting up the NAND flash memory 20 can be changed under the control of the memory controller, it is possible to prevent excessive deterioration of the memory element in the fuse area, and improve reliability of the memory system.

Second Embodiment

In the memory system of the first embodiment, it is possible to prevent excessive deterioration of the memory element in the fuse area. In the memory system according to a second embodiment, it is possible to cope with the deterioration of the memory element in the first copy area.

Figure 10:
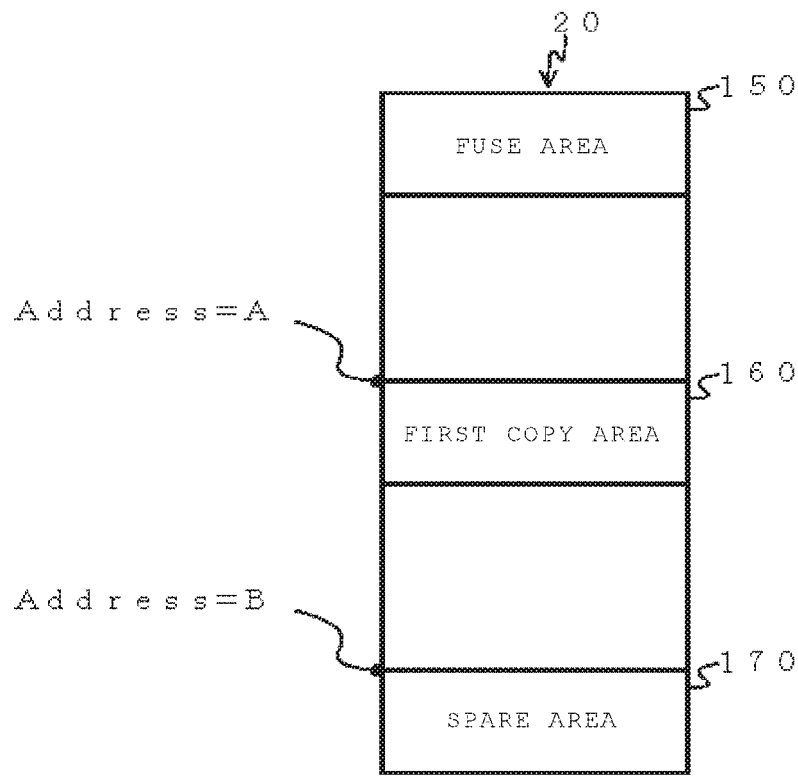
FIG. 10 schematically illustrates a memory configuration according to a second embodiment.

FIG. 10 schematically illustrates a memory configuration of the present embodiment.

The memory controller 10 of the present embodiment manages a memory area of a part of the NAND flash memory 20 as a spare area 170 in addition to the first copy area 160. The spare area 170 is one physical block 110 in the present embodiment, but the configuration of the spare area 170 is not limited thereto.

In the spare area 170, write, read, and erase of data can be performed under the control of the memory controller 10 similarly to the first copy area 160. The spare area 170 is accessed by being associated with an address=B designated by the memory controller 10.

The memory controller 10 manages a parameter (in the following, referred to as refresh parameter) that can estimate the corruption degree of the data in the first copy area 160 or the deterioration degree of the memory element comprising the first copy area 160. It is possible to adopt (1) the number of times the start-up information has been read from the first copy area 160, (2) the number of error bits in the start-up information that is read from the first copy area 160, (3) an access interval for the first copy area 160, and the like, as the refresh parameter.

A case where (1) the number of times the start-up information has been read from the first copy area 160 is used as the refresh parameter, will be described as an example. Here, the memory controller 10 counts the number of times that the start-up information has been read from the first copy area 160. When the number of times that the start-up information has been read exceeds a predetermined refresh threshold, the memory controller 10 performs the refresh process. The refresh process will be described below in detail.

A case where (2) the number of error bits in the start-up information read from the first copy area 160 is used as the refresh parameter, will be described. The ECC control unit 90 performs an error correction process with respect to the start-up information that is read from the first copy area 160. When the number of error bits detected during the error correction process exceeds a predetermined refresh threshold, the memory controller 10 performs the refresh process.

A case where (3) the access interval for the first copy area 160 is used as the refresh parameter, will be described. At a time of reading the start-up information from the first copy area 160, the memory controller 10 starts operating a timer (not shown). This timer counts up from zero each time a constant time elapses. The timer restarts with zero whenever the start-up information is read from the first copy area 160. When the value of the timer exceeds a predetermined refresh threshold, the memory controller 10 performs the refresh process.

Next, with reference to FIG. 11A and FIG. 11B, the refresh process will be described. There are two methods in the refresh process in the present embodiment.

Figure 11A:
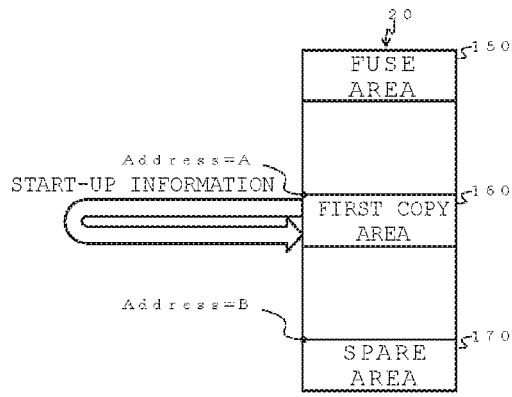
FIGS. 11A and 11B schematically illustrate refresh processes according to the second embodiment.

In a first method, as described in FIG. 11A, the start-up information that has been read from the first copy area 160 is stored in the first copy area 160 again. At this time, the memory controller 10 may perform the error correction process with the ECC control unit 90 with respect to the start-up information that has been read, and may store in the first copy area 160 the start-up information for which an error has been corrected. By storing the start-up information in the first copy area 160 again, it is possible to refresh data in the memory elements in the first copy area 160 again, and reduce the error occurrence probability at the next time of reading the start-up information.

Figure 11B:
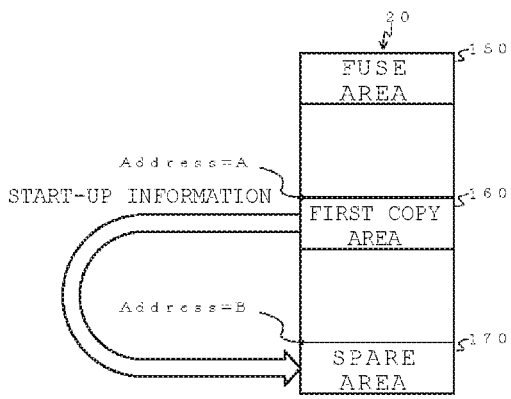

In a second method, as described in FIG. 11B, the start-up information read from the first copy area 160 is stored in the spare area 170. Also, at this time, the memory controller 10 may store in the spare area 170 the start-up information for which an error has been corrected. In addition, the memory controller 10 stores the address=B associated with the spare area 170 in the buffer 30. Then, the memory controller 10 designates the address=B upon issuing the start-up information read command with address designation.

Next, with reference to FIG. 12A and FIG. 12B, a control procedure of FW at the time of the refresh process will be described.

Figure 12A:
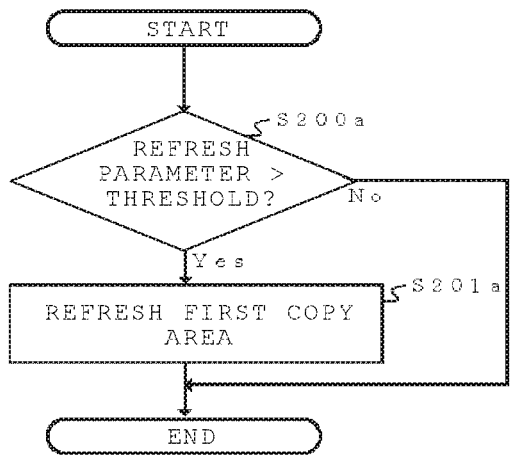
FIGS. 12A and 12B schematically illustrate control procedures of firmware at the time of the refresh processes according to the second embodiment.

FIG. 12A corresponds to the refresh process shown in FIG. 11A.

When the refresh parameter exceeds a refresh threshold value (S200a: Yes), the CPU 40 instructs the NAND control unit 80 to store, in the first copy area 160 again, the start-up information that has been read from the first copy area 160, based on the FW (S201a).

Figure 12B:
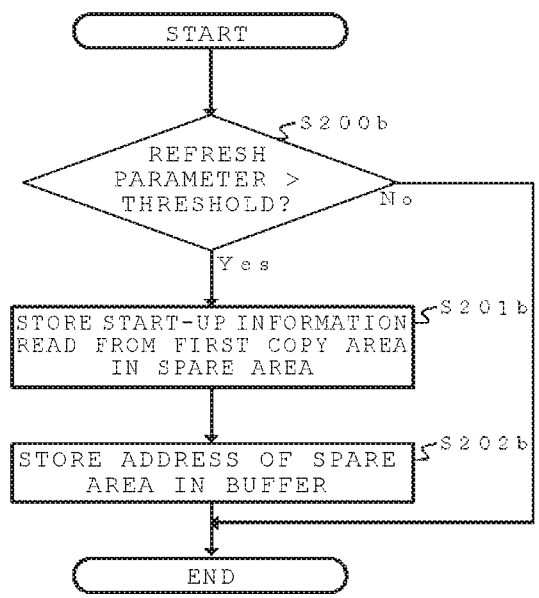

FIG. 12B corresponds to the refresh process shown in FIG. 11B.

When the refresh parameter exceeds the refresh threshold value (S200b: Yes), the CPU 40 instructs the NAND control unit 80 to store, in the spare area 170, the start-up information that has been read from the first copy area 160, based on the FW (S201b). The CPU 40 stores the address=B associated with the spare area 170 in the buffer 30 (S202b).

So far, the refresh process has been described. In the following, a recovery process at a time of the failing on reading the start-up information from the first copy area 160 will be described.

When an uncorrectable error in the start-up information read from the first copy area 160 is detected as a result of the error correction processing of the ECC control unit 90, the memory controller 10 performs the recovery process.

Figure 13A:
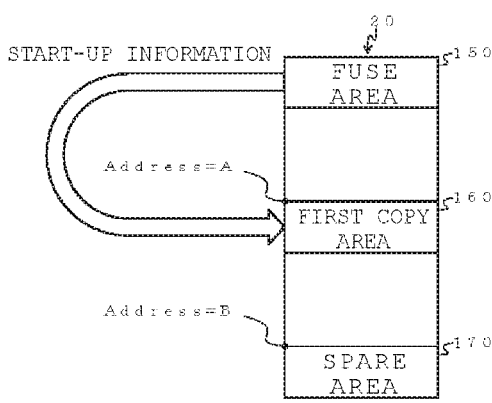
FIGS. 13A and 13B schematically illustrate recovery processes according to the second embodiment.
Figure 13B:
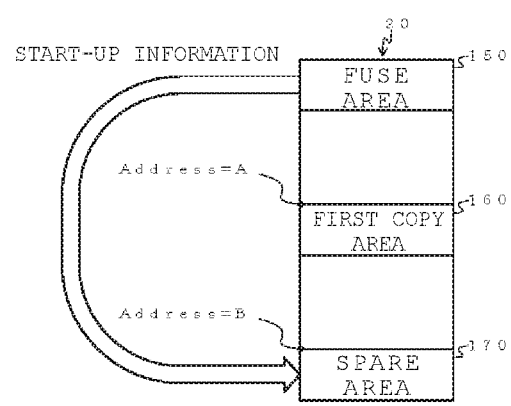

FIG. 13A and FIG. 13B schematically illustrate configuration of the NAND flash memory 20 for explaining the recovery process. There are two methods in the recovery process in the present embodiment.

In a first method, as described in FIG. 13A, the start-up information read from the fuse area 150 is stored in the first copy area 160 again. By storing the start-up information in the first copy area 160 again, it is possible to refresh data in the memory elements in the first copy area 160, and reduce the error occurrence probability at the time of reading the start-up information.

In a second method, as described in FIG. 13B, the start-up information read from the fuse area 150 is stored in the spare area 170. In addition, the memory controller 10 stores the address=B associated with the spare area 170 in the buffer 30. Accordingly, the memory controller 10 designates the address=B upon issuing the start-up information read command with address designation.

Next, with reference to FIG. 14A and FIG. 14B, a control procedure of FW at the time of the recovery process will be described.

Figure 14A:
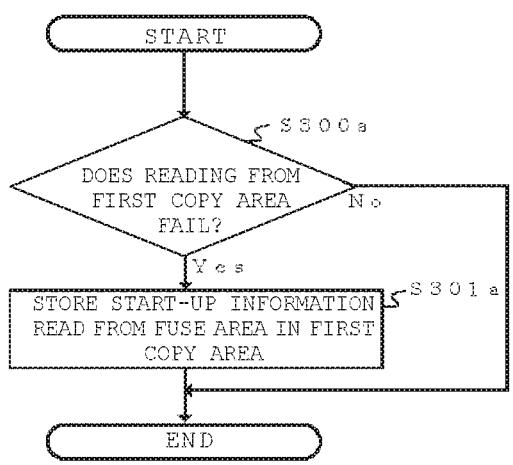
FIGS. 14A and 14B are flowcharts for explaining the control procedures of firmware at the time of the recovery processes according to the second embodiment.

FIG. 14A corresponds to the recovery process shown in FIG. 13A.

When reading of the start-up information from the first copy area 160 fails (S300a: Yes), the CPU 40 instructs the NAND control unit 80 to store, in the first copy area 160 again, the start-up information read from the fuse area 150, based on the FW (S301a). At this time, the NAND control unit 80 may issue a start-up information copy command designating the address=A as a copy destination to the NAND flash memory 20.

Figure 14B:
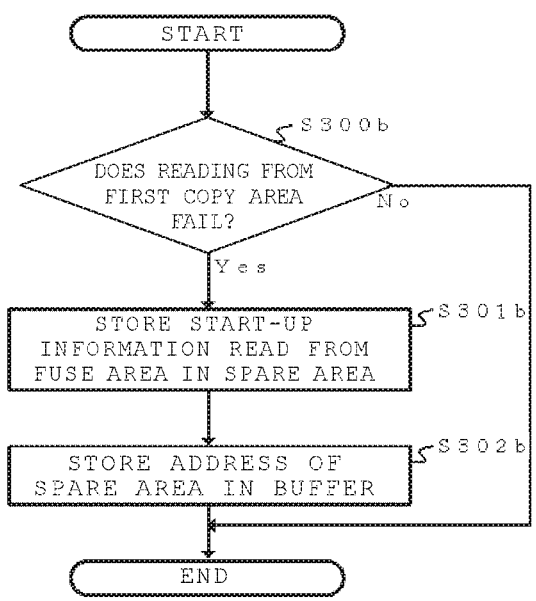

FIG. 14B corresponds to the recovery process shown in FIG. 13B.

When reading of the start-up information from the first copy area 160 fails (S300b: Yes), the CPU 40 instructs the NAND control unit 80 to store, in the spare area 170, the start-up information read from the fuse area 150, based on the FW (S301b). At this time, the NAND control unit 80 may issue a start-up information copy command designating the address=B as a copy destination to the NAND flash memory 20. The CPU 40 stores the address=B associated with the spare area 170 in the buffer 30 (S302b).

According to the memory system of the second embodiment described above, since the memory system performs the refresh process when the deterioration degree of the memory element in the first copy area is estimated to be high, and the memory system performs the recovery process when the reading of the start-up information from the first copy area fails, it is possible to further improve reliability of the memory system.

Third Embodiment

In the memory system of the first embodiment, it is possible to prevent excessive deterioration of the memory element in the fuse area. In the memory system according to a third embodiment, it is possible to further reduce the number of times that the start-up information has been read from the fuse area.

Figure 15:
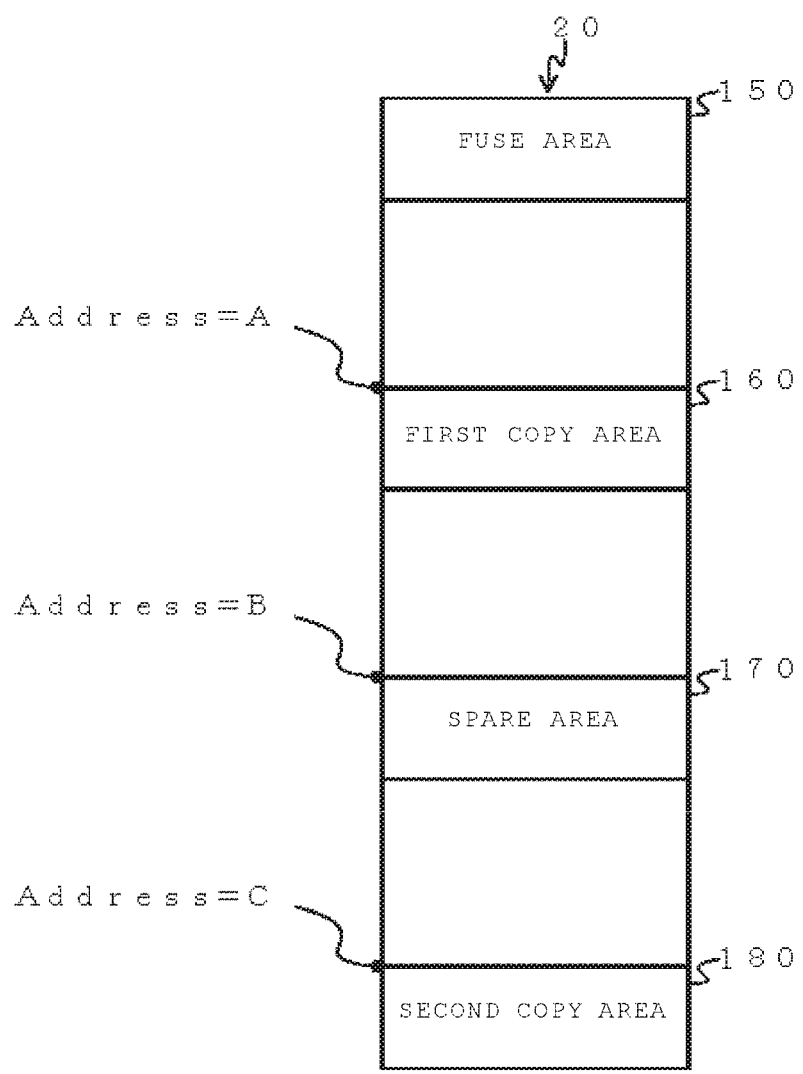
FIG. 15 schematically illustrates a memory configuration according to a third embodiment.

FIG. 15 schematically illustrates a memory configuration of the present embodiment.

The memory controller 10 of the present embodiment manages a part of the NAND flash memory 20 as a second copy area 180, in addition to the first copy area 160 and the spare area 170. The second copy area 180 is one physical block 110 in the present embodiment, but the configuration of the second copy area 180 is not limited thereto.

In the second copy area 180, write, read, and erase of data can be performed under the control of the memory controller 10, similarly to the first copy area 160. The second copy area 180 is accessed by being associated with an address=C from the memory controller 10.

Figure 16:
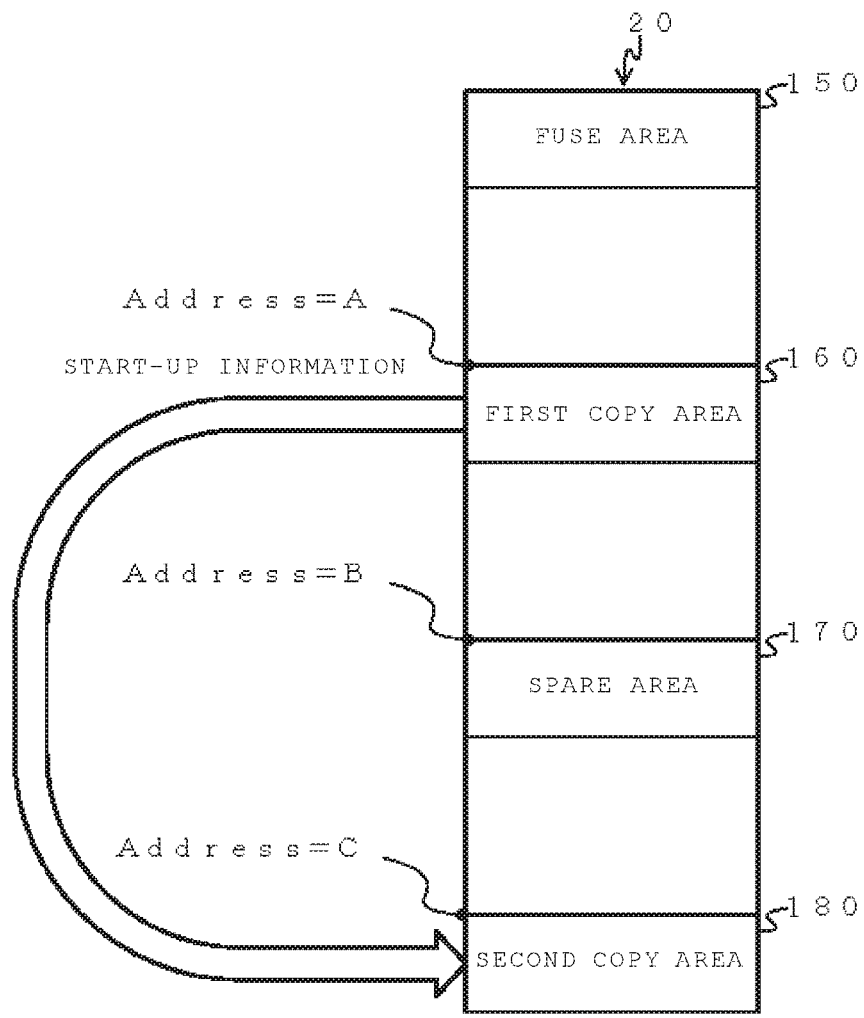
FIG. 16 schematically illustrates memory areas to store start-up information according to the third embodiment.

As described in FIG. 16, after the memory controller 10 reads the start-up information from the fuse area 150 and stores the read start-up information in the first copy area 160, the memory controller 10 can then read the start-up information from the first copy area 160 and store the read start-up information in the second copy area 180.

Next, with reference to FIG. 17A and FIG. 17B, the refresh process and the recovery process in the present embodiment will be described.

Figures 17A, 17B:
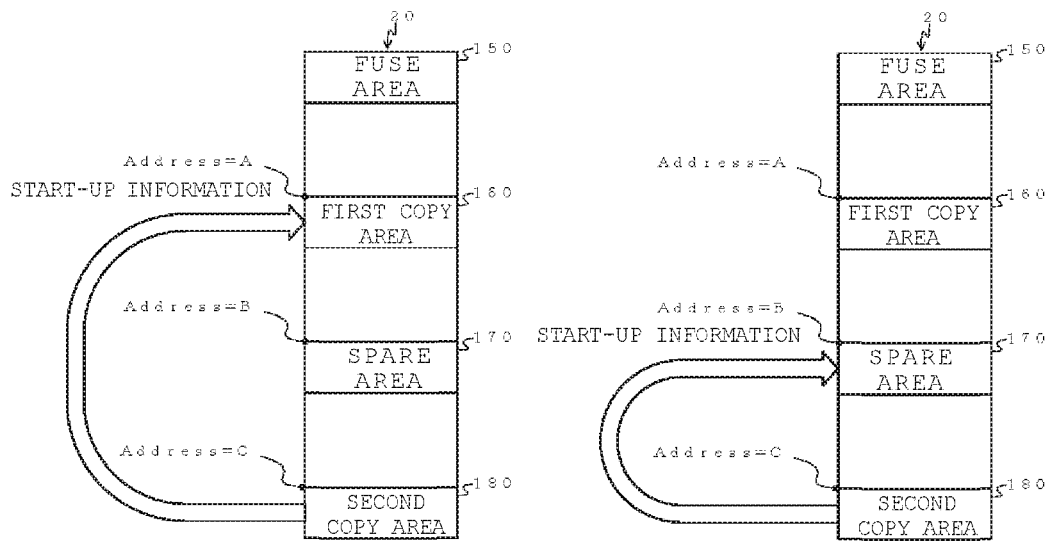
FIGS. 17A and 17B schematically illustrate the refresh processes and the recovery processes according to the third embodiment.

FIG. 17A schematically illustrates a configuration of the NAND flash memory 20 for explaining the refresh process in the present embodiment. When the refresh parameter exceeds the predetermined refresh threshold, the memory controller 10 reads the start-up information from the second copy area 180, and then stores the read start-up information in the first copy area 160. Alternately, although it is not shown specifically in FIG. 17A, the memory controller 10 may read the start-up information from the second copy area 180, and thereby may store the read start-up information in the spare area 170.

FIG. 17B schematically illustrates a configuration of the NAND flash memory 20 for explaining the recovery process in the present embodiment. When reading of the start-up information from the first copy area 160 fails, the memory controller 10 reads the start-up information from the second copy area 180, and stores this read start-up information in the spare area 170. Alternately, although it is not shown in FIG. 17B, the memory controller 10 may read the start-up information from the second copy area 180, and thereby may store the read start-up information in the first copy area 160 again. Further, when reading the start-up information stored in the second copy area 180 has been failed, it can be recovered by copying the start-up information from the fuse area 150 to the second copy area 180.

By reading the start-up information from the second copy area 180, it is possible to further reduce the number of times that the start-up information has been read from the fuse area 150, compared to the second embodiment (see, e.g. FIGS. 13A and 13B).

According to the memory system of the third embodiment described above, since it is possible to read the start-up information from the second copy area, it is possible to further reduce the number of times that the start-up information is read from the fuse area, and further improve reliability of the memory system.

According to the memory system of at least one embodiment described above, since it is possible to change the memory area which stores the start-up information under the control of the memory controller at the time of starting up the NAND flash memory, it is possible to prevent excessive deterioration of the memory element in the fuse area, and improve reliability of the memory system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory including a first memory region and a second memory region, the first memory region storing start-up data, the start-up data being to be used by the nonvolatile memory to start up the nonvolatile memory; and
   a controller configured to:
      instruct the nonvolatile memory to copy the start-up data from the first memory region to the second memory region; and
      issue at least one of a first command and a second command to the nonvolatile memory, the first command designating no address, the second command designating a first address, wherein
   the nonvolatile memory is configured to:
      in response to the first command, read the start-up data from the first memory region; and,
      in response to the second command, read the start-up data from the second memory region at the first address.

2. The memory system according to claim 1, wherein the start-up data is stored in the first memory region prior to shipment of the memory system.

3. The memory system according to claim 2, wherein the first memory region is a read-only region after the shipment of the memory system.

4. The memory system according to claim 1, wherein
   the nonvolatile memory further includes a third memory region,
   the controller is further configured to issue a third command to the nonvolatile memory, the third command designating a second address, and
   the nonvolatile memory is further configured to, in response to the third command, copy the start-up data from the second memory region to the third memory region at the second address.

5. The memory system according to claim 4, wherein
   the controller is further configured to issue a fourth command to the nonvolatile memory, the fourth command designating the second address, and
   the nonvolatile memory is further configured to, in response to the fourth command, read the start-up data from the third memory region at the second address.

6. The memory system according to claim 5, wherein the nonvolatile memory is a NAND-type flash memory.

7. The memory system according to claim 1, further comprising:
   a volatile memory, wherein
   the controller is configured to:
      issue the first command if an address for designating the second memory region is not stored in the volatile memory; and
      issue the second command if the address for designating the second memory region is stored in the volatile memory.

8. A nonvolatile memory to be controlled by a controller, the nonvolatile memory comprising:

a first memory region and a second memory region, the first memory region storing start-up data, the start-up data being to be used by the nonvolatile memory to start up the nonvolatile memory, wherein the nonvolatile memory is configured to:
- copy the start-up data from the first memory region to the second memory region;
- in response to a first command received from the controller, the first command designating no address, read the start-up data from the first memory region; and
- in response to a second command received from the controller, the second command designating a first address, read the start-up data from the second memory region at the first address.

9. The nonvolatile memory according to claim 8, wherein the start-up data is stored in the first memory region prior to shipment of the nonvolatile memory.

10. The nonvolatile memory according to claim 9, wherein the first memory region is a read-only region after the shipment of the nonvolatile memory.

11. The nonvolatile memory according to claim 8, further comprising:

a third memory region, wherein
the nonvolatile memory is further configured to, in response to a third command received from the controller, the third command designating a second address, copy the start-up data from the second memory region to the third memory region at the second address.

12. The nonvolatile memory according to claim 11, wherein
the nonvolatile memory is further configured to, in response to a fourth command received from the controller, the fourth command designating the second address, read the start-up data from the third memory region at the second address.

13. The nonvolatile memory according to claim 8, wherein the nonvolatile memory is a NAND-type flash memory.

14. A method of controlling a nonvolatile memory, the nonvolatile memory including a first memory region and a second memory region, the first memory region storing start-up data, the start-up data being to be used by the nonvolatile memory to start up the nonvolatile memory, the method comprising:

instructing the nonvolatile memory to copy the start-up data from the first memory region to the second memory region;

issuing a first command to the nonvolatile memory, the first command designating no address, the first command instructing the nonvolatile memory to read the start-up data from the first memory region; and issuing a second command to the nonvolatile memory, the second command designating a first address, the second command instructing the nonvolatile memory to read the start-up data from the second memory region at the first address.

15. The method according to claim 14, wherein the start-up data is stored in the first memory region prior to shipment of the nonvolatile memory.

16. The method according to claim 15, wherein the first memory region is a read-only region after the shipment of the nonvolatile memory.

17. The method according to claim 14, wherein
the nonvolatile memory further includes a third memory region, and
the method further comprises, issuing a third command to the nonvolatile memory, the third command designating a second address, the third command instructing the nonvolatile memory to copy the start-up data from the second memory region to the third memory region at the second address.

18. The method according to claim 17, further comprising:

issuing a fourth command to the nonvolatile memory, the fourth command designating the second address, the fourth command instructing the nonvolatile memory to read the start-up data from the third memory region at the second address.

19. The method according to claim 14, wherein the nonvolatile memory is a NAND-type flash memory.

20. The method according to claim 14, wherein
the first command is issued if an address for designating the second memory region is not stored in a volatile memory; and
the second command is issued if the address for designating the second memory region is stored in the volatile memory.

* * * * *